(12) United States Patent
Yamamoto et al.

(10) Patent No.: US 6,664,715 B2
(45) Date of Patent: Dec. 16, 2003

(54) PIEZOELECTRIC ACTUATOR AND METHOD FOR DRIVING THE SAME

(75) Inventors: Takashi Yamamoto, Chiryu (JP); Youta Iwamoto, Inabe-gun (JP)

(73) Assignee: Denso Corporation, Aichi-Pref. (JP)

( * ) Notice: Subject to any disclaimer, the term of this patent is extended or adjusted under 35 U.S.C. 154(b) by 0 days.

(21) Appl. No.: 10/166,114

(22) Filed: Jun. 11, 2002

(65) Prior Publication Data

US 2002/0185935 A1 Dec. 12, 2002

(30) Foreign Application Priority Data

Jun. 11, 2001 (JP) .......................... 2001-175885

(51) Int. Cl.[7] .......................................... H01L 41/187
(52) U.S. Cl. ........................................ 310/358
(58) Field of Search ........................... 310/358

(56) References Cited

U.S. PATENT DOCUMENTS 5,792,379 A * 8/1998 Dai et al. ............. 252/62.9 PZ
6,091,183 A 7/2000 Nishimura et al. ......... 310/358
6,231,779 B1 * 5/2001 Chiang et al. ......... 252/62.9 R

FOREIGN PATENT DOCUMENTS

| JP | 9-55549 | 2/1997 | ........... H01L/41/09 |
| JP | 2001-144341 | * 5/2001 | ........... H01L/41/09 |

* cited by examiner

*Primary Examiner*—Thomas M. Dougherty
(74) *Attorney, Agent, or Firm*—Nixon & Vanderhye PC

(57) ABSTRACT

This invention provides a piezoelectric actuator exhibiting a small change of displacement even when ranges of use conditions such as a temperature, an electric field and a compressive stress are broad, and a driving method of the piezoelectric actuator. In the piezoelectric actuator 1 using a piezoelectric body 11 undergoing displacement upon application of a voltage, a crystalline structure of the piezoelectric body 11 substantially exists on a tetragonal system side outside of a morphotropic phase boundary (MPB) between the tetragonal system and a rhombohedral system under conditions of the lowest temperature, the lowest electric field and the maximum compressive stress that are used.

16 Claims, 5 Drawing Sheets

PIEZOELECTRIC ACTUATOR AND METHOD FOR DRIVING THE SAME

BACKGROUND OF THE INVENTION

1. Field of the Invention

This invention relates to a piezoelectric actuator for use in a strong electric field, at a high compressive stress and in a broad temperature range, and to a method for driving the same.

2. Description of the Related Art

A piezoelectric actuator using a piezoelectric body as a driving source exhibits a correct display amount. Therefore, the use of the piezoelectric actuator as a driving source for driving a valve body of a liquid injection apparatus such as an injector has been examined.

PZT (lead zirco-titanate) type oxides having an $ABO_3$ type perovskite structure are known as piezoelectric bodies as described in Japanese Unexamined patent Publication (Kokai) No. 9-55549, for example.

Such piezoelectric bodies include a tetragonal system and a rhombohedral system depending on their compositions. It has been clarified that a morphotropic phase boundary (MPB) exists between these crystal phases. It has also been clarified that the piezoelectric characteristics such as the dielectric constant, the piezoelectric strain constant, etc, become maximal on the MPB.

The Japanese Unexamined Patent Publication (Kokai) No. 9-55549 described above discloses that temperature dependence of displacement and that of the dielectric constant can be reduced when a material that is tetragonal at a higher temperature in the proximity of the MPB between the tetragonal and rhombohedral phases and is rhombohedral when a lower temperature is selected. When such a material is selected, temperature characteristics can be improved in a weak electric field and at a low compressive stress. and at a low compressive stress.

However, it has been required in recent years for the actuators to exhibit a small displacement at a high electric field and a high compressive stress and in a broad temperature range, and the prior art technologies described above cannot alone satisfy such needs.

SUMMARY OF THE INVENTION

In view of the problems of the prior art technologies described above, this invention contemplates to provide a piezoelectric actuator exhibiting a small displacement in a broad range of use conditions of temperatures, electric fields and compressive stresses and a driving method of the same.

According to a first aspect of the invention, there is provided a piezoelectric actuator using a piezoelectric body undergoing displacement upon application of a voltage as a driving source, characterized in that a crystalline structure of the piezoelectric body substantially exists on a tetragonal system side outside of a morphotropic phase boundary (MPB) between the tetragonal system and a rhombohedral system under a condition of the lowest temperature, the smallest electric field and the maximum compressive stress that are used.

The piezoelectric actuator according to the invention uses a piezoelectric body having a specific crystalline structure under the specific condition described above. In other words, the invention stipulates the crystalline structure of the piezoelectric body under the three specific conditions, that is, the lowest temperature in the temperature range in which the piezoelectric actuator is used, the lowest electric field in the range in which the piezoelectric actuator is used and the maximum compressive stress in the range employed.

The crystalline structure of the piezoelectric body so stipulated substantially exists on the tetragonal system side outside of the morphotropic phase boundary (MPB) between the tetragonal system and the rhombohedral system as described above. When this requirement is satisfied, the crystalline structure of the piezoelectric body does not change to the rhombohedral system even when the temperature, electric field and compressive stress used change, but always retains the tetragonal system. In the piezoelectric body described above, the tetragonal system is superior to the rhombohedral system in reliability.

Therefore, even when the use conditions of the piezoelectric actuator such as the temperature, the electric field and the compressive stress change, the crystalline structure of the piezoelectric body does not change but remains the tetragonal system, and can maintain relatively stable characteristics.

The invention sets the crystalline structure of the piezoelectric body so that it exists in the proximity of the morphotropic phase boundary (MPB) between the tetragonal system and the rhombohedral system and moreover, substantially on the tetragonal system side while the three specific conditions described above are satisfied. In this way, even when the use conditions change, the piezoelectric body can keep the tetragonal system relatively approximate to MPB and its characteristics in an excellent condition.

Therefore, the invention can provide a piezoelectric actuator having a small change of displacement even when the ranges of the use conditions of the temperature, the electric field and the compressive stress are broad.

According to a second aspect of the invention, there is provided a method for driving a piezoelectric actuator using a piezoelectric body undergoing displacement upon application of a voltage as a driving source, characterized in that the piezoelectric body is constituted so that a crystalline structure thereof substantially exists on a tetragonal system side outside of a morphotropic phase boundary (MPB) between the tetragonal system and a rhombohedral system under a condition of the lowest temperature, the lowest electric field and the maximum compressive stress that are used, and that the piezoelectric body is driven under a condition of at least the lowest temperature, at least the lowest electric field and not greater than the maximum compressive stress.

As described above, the method for driving the piezoelectric actuator according to the invention uses the piezoelectric body having the specific crystalline structure under the three specific conditions when the piezoelectric actuator is used. When the piezoelectric body is driven under the conditions of at least the lowest temperature, at least the lowest electric field and not greater than the maximum compressive stress described above, the piezoelectric body can always keep the crystalline structure of the tetragonal system.

Even when the use conditions change, the tetragonal system relatively near MPB can be kept, and the characteristics of the piezoelectric body can be kept under the excellent condition. Therefore, this driving method can minimize the change of the displacement of the piezoelectric body to be driven even when the ranges of the use conditions of the temperature, the electric field and the compressive stress are broad.

DESCRIPTION OF THE PREFERRED EMBODIMENTS

Figure 1:
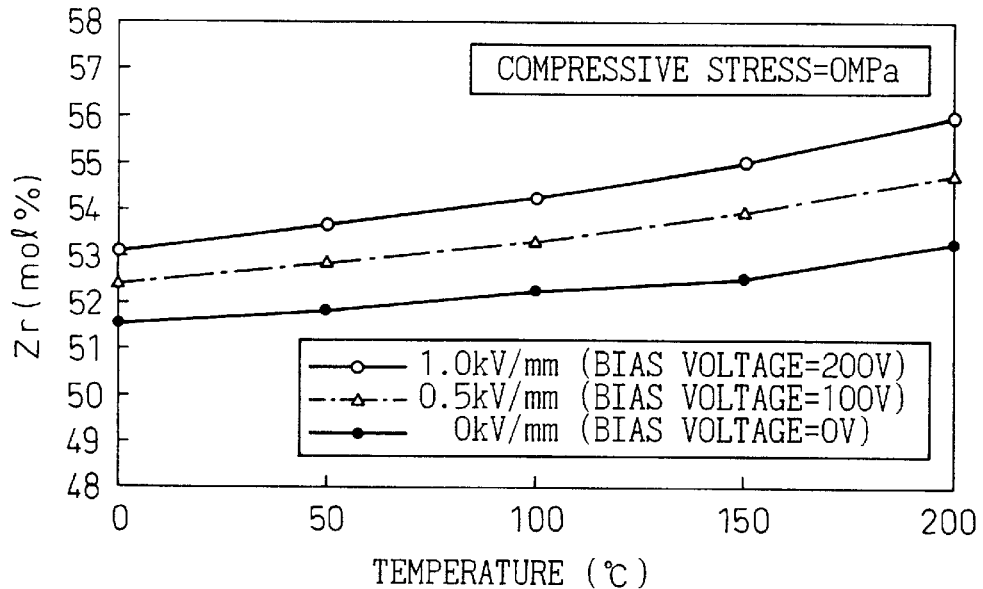
FIG. 1 is an explanatory view showing a Zr amount in MPB when a temperature and a bias voltage are changed in Embodiment 1.

In the first aspect of the invention described above, the piezoelectric element is preferably made of a PZT type oxide having an $ABO_3$ type perovskite structure.

It is known that the characteristics such as the dielectric constant exhibit the maximum value at the MPB in the PZT ($PbZr_xTi_yO_3$, x+y=1, x>0, y>0) type materials. The crystalline structure of the PZT material has an $ABO_3$ type perovskite structure, and the materials near the MPB can be formed depending on the kind of the constituent elements on the A and B sites, their amount and their proportion. However, it is most customary to regulate the molar ratio (Zr/Ti) of Zr and Ti constituting the B site.

The term "composition near MBP" means a composition in which the tetragonal and rhombohedral systems co-exist at a room temperature and at a low electric field in the absence of stress. When dependence of the displacement, etc, on the Zr/Ti ratio is expressed by a graph, this term represents within ±10% of the Zr/Ti ratio providing the maximum value.

The term "substantially on the tetragonal system side" means a composition in which the Zr/Ti ratio is smaller than the Zr/Ti ratio providing the maximum value of the displacement.

It has been clarified through experiments that even when the material composition is so determined as to attain the composition near MPB at a room temperature and at a low electric field in the absence of the stress, the Zr/Ti ratio providing the composition near the MBP varies depending on the electric field and on the compressive stress.

Therefore, the invention decides the material composition of the PZT while taking all the factors such as the temperature, the electric field and the compressive stress as the use conditions into account, and can acquire a piezoelectric body having an extremely small change of displacement within the environmental condition of the use, and a piezoelectric actuator using the piezoelectric body.

The temperature range in which the piezoelectric actuator is used is preferably from –40 to 200° C. The range of the use of the piezoelectric actuator can be almost fully covered when this temperature condition is satisfied. A temperature above –40° C. is an ordinary use temperature of the piezoelectric actuator. When the temperature exceeds 200° C., on the other hand, the temperature approaches a Curie point of the PZT type oxide, and displacement drops undesirably.

The range of the compressive stress in which the piezoelectric actuator is used is preferably more than 0 and not more than 40 MPa. The maximum value of the range of the compressive stress is sufficiently 40 MPa when the piezoelectric actuator is used generally.

The range of the electric field in which the piezoelectric actuator is used is preferably from a negative electric coercive field to 4 kV/mm at the temperature employed.

Here, the electric coercive field will be briefly explained. When an electric field E is applied to a polarized piezoelectric material in a direction opposite to a field at the time of polarization, depolarization takes place. The negative electric field E when depolarization is zero (0) is referred to as the "negative electric coercive force Ec".

The negative electric field defined in this way is used to represent the range of the electric field in which the piezoelectric actuator is used. As described above, the range of the electric field is preferably from the negative electric coercive field to 4 kV/mm at the use temperature. When the range of the electric field is lower than the negative electric coercive force at the use temperature, a problem occurs in that displacement of the piezoelectric actuator decreases due to depolarization. When the range of the electric field is greater than 4 kV/mm, on the other hand, the stress occurring due to distortion of the material becomes great, and breakdown sometimes occurs in an integral sintering-type piezoelectric actuator, for example.

The temperature range for the use of the piezoelectric actuator is preferably from –40° C. to the Curie point of the PZT type oxide. As described above, the lower limit value of the temperature used is generally –40° C. When the temperature is higher than the Curie point, on the other hand, the crystalline structure becomes cubic and the displacement drastically decreases.

The range of the electric field in which the piezoelectric actuator is used may also be from 0 to 4 kV/mm. In this case, when the piezoelectric actuator is used within the range of the electric field of 0 kV/mm or above, depolarization does not occur. Since polarization incessantly occurs during driving, the piezoelectric actuator can be used up to a temperature near the Curie point of the PZT type oxide. On the other hand, when the range of the electric field exceeds 4 kV/mm, the stress occurring due to distortion of the material becomes so great that breakdown sometimes occurs in the case of the integral sintering type piezoelectric actuator, for example, as described above.

The range of the compressive stress in which the piezoelectric actuator is used is preferably more than 0 and not more than 40 MPa. The maximum value of the range of the compressive stress is sufficiently 40 MPa when the piezoelectric actuator is used generally.

In the second aspect of the invention, too, the piezoelectric body is preferably the PZT type oxide having the $ABO_3$ type perovskite structure.

The temperature range for the use of the piezoelectric actuator is preferably from –40 to 200° C. for the same reason as described above.

The range of the compressive stress in which the piezoelectric actuator is used is preferably more than 0 and not more than 40 MPa for the same reason as described above.

The range of the electric field in which the piezoelectric actuator is used is preferably from a negative electric coercive field to 4 kV/mm at the use temperature for the same reason as described above.

The temperature range for the use of the piezoelectric actuator is preferably from –40° C. to the Curie point of the PZT type oxide. As described above, the lower limit value of the temperature used is generally –40° C. When the temperature is higher than the Curie point, on the other hand, the crystalline structure becomes cubic and the displacement drastically decreases.

The range of the compressive stress in which the piezoelectric actuator is used is preferably more than 0 and not more than 40 MPa. The maximum value of the range of the compressive stress is sufficiently 40 MPa when the piezoelectric actuator is used generally.

The range of the electric field in which the piezoelectric actuator is used may also be from 0 to 4 kV/mm. In this case, when the piezoelectric actuator is used within the range of the electric field of 0 kV/mm or above, depolarization does not occur. Since polarization incessantly occurs during driving, the piezoelectric actuator can be used up to a temperature near the Curie point of the PZT type oxide. On the other hand, when the range of the electric field exceeds 4 kV/mm, the stress occurring due to distortion of the material becomes so great that breakdown sometimes occurs in the case of the integral sintering type piezoelectric actuator, for example, as described above.

[Embodiment 1]

This embodiment determines a composition the crystalline structure of which substantially exists on the tetragonal system side outside of the morphotropic phase boundary (MPB) between the tetragonal system and the rhombohedral system when the PZT type $ABO_3$ perovskite compound is used as the piezoelectric body under the conditions of the lowest temperature, the lowest electric field and the maximum compressive stress when the piezoelectric body is used.

First, in the PZT crystal having the $ABO_3$ perovskite structure, the Pb position on the A site is replaced by 9 mol % Sr and the (Zr, Ti) position on the B site is replaced by 1 mol % (Y: 1/2, Nb: 1/2) to prepare PZT in which Zr/Ti (molar ratio) is changed.

The Zr/Ti ratio (molar ratio) can be one of ten kinds, that is, 48/52, 49/51, 50/50, 51/49, 52/48, 53/47, 54/46, 55/45, 56/44 and 57/43.

Next, PbO, $SrCO_3$, $ZrO_2$, $TiO_2$, $Y_2O_3$, $Nb_2O_5$ and $Mn_2O_3$ as starting powder are weighed so that 0.2 wt % of Mn in terms of $Mn_2O_3$ is contained in each of these perovskite compositions. These starting materials are mixed in a wet ball bill and the resulting mixture is calcined at 700 to 900° C. for 1 to 5 hours.

The resulting calcined body is pulverized in a ball mill, and a binder such as water, polyvinyl alcohol, or the like, is added and is further mixed. The mixture is then granulated through means such as a spray dryer. The resulting granulated powder is pressure molded at a pressure of 300 to 1,000 kgf/cm$^2$ and is sintered at 1,000 to 1,200° C. for 0.5 to 4 hours to obtain a sintered body as a piezoelectric body.

Each of the sintered bodies so obtained is processed into a disk having a diameter of 10 mm and a thickness of 0.2 mm, and electrodes made of an electrically conductive material such as silver are formed on both end faces by a known method.

A voltage of 2 to 4 kV/mm is applied to each disk at 20 to 150° C. for 10 to 60 minutes for polarization treatment.

After the disk is left standing for 24 hours, the electrostatic capacity is measured at a compressive stress of 0 to 40 MPa, a bias voltage of 0 to 200 V (1 kV/mm) and a temperature of 0 to 200° C.

Here, an impedance analyzer is used to measure the electrostatic capacity at a frequency of 1 kHz (sine wave) and an amplitude of ±1V.

Figure 2:
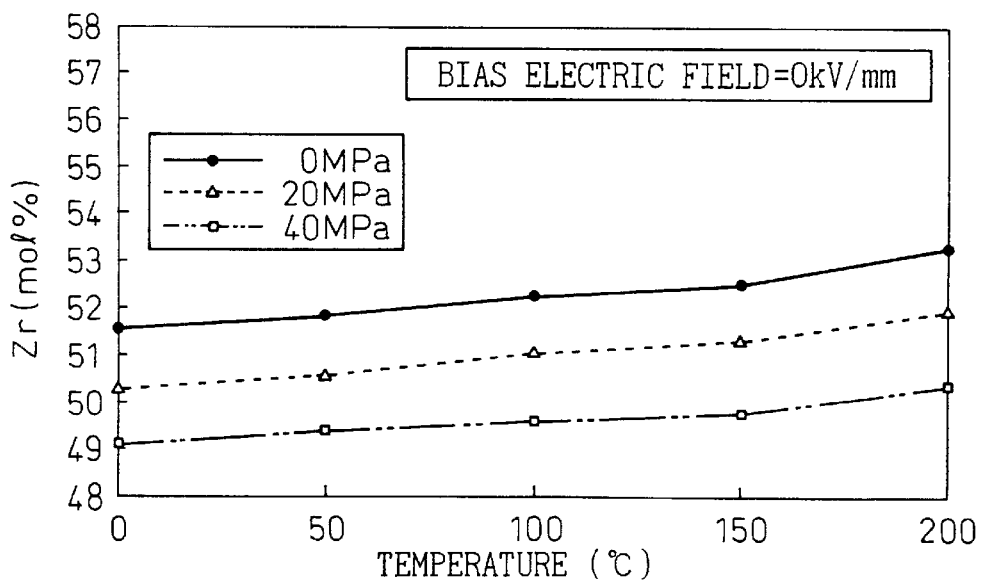
FIG. 2 is an explanatory view showing a Zr amount in MPB when a temperature and a compressive stress are changed in Embodiment 1.

FIGS. 1 and 2 show the measurement result.

In FIG. 1, the abscissa represents the temperature (° C.) and the ordinate does Zr (mol %). While the compressive stress is kept constant at 0 MPa, three kinds of bias voltages are applied to plot the Zr mol % at which the electrostatic capacity attains a maximum value.

In FIG. 2, the abscissa represents the temperature (° C.) and the ordinate represents the Zr (mol %). While the voltage is kept constant at 0 V, three kinds of compressive stress are applied to plot Zr mol % at which the electrostatic capacity attains a maximum value.

As can be seen from FIG. 1, the Zr amount that attains MPB shifts to a greater amount when the bias electric field is increased.

As can be seen from FIG. 2, the Zr amount that attains MPB shifts to a smaller amount when the compressive stress becomes higher.

It can be also understood from FIGS. 1 and 2 that the Zr amount attaining the morphotropic phase boundary (MPB) between the tetragonal system and the rhombohedral system shifts to a greater amount when the temperature becomes higher, irrespective of the values of the compressive stress and the bias electric field.

It can be understood from the observation described above that in order to always achieve the crystalline structure on the side of the tetragonal system outside of MPB (a region in which the Zr molar amount is smaller from MPB) under the use condition, the piezoelectric body may well have a composition near MPB under the conditions of the lowest temperature, the lowest voltage and the highest compressive stress used.

Here, the reason why the tetragonal side outside of MPB is better will be briefly explained.

When the piezoelectric actuator made of the PZT type oxide (hereinafter called the "PZT actuator" from time to time) is driven, a problem of self-exothermy occurs. The reverse piezoelectric effect and the domain rotation effect induce the displacement of the PZT actuator, and the latter invites self-exothermy. The electric field in which this domain rotation effect starts appearing is near the electric coercive field described above. To suppress self-exothermy, the electric coercive field is preferably far from zero. It is when the crystalline structure is either tetragonal or rhombohedral that PZT exhibits the piezoelectric effect. Generally, the tetragonal crystal has Ec about twice that of the rhombohedral crystal. Therefore, the PZT crystalline structure is preferably always tetrahedral rather than always rhombohedral.

[Embodiment 2]

An optimal piezoelectric actuator is produced on the assumption that the range of the temperature for use is from −40 to 200° C., the range of the compressive stress is from 0 to 40 MPa and the range of the electric field is from 0 to 4 kV/mm at the lowest temperature for use.

Figure 3:
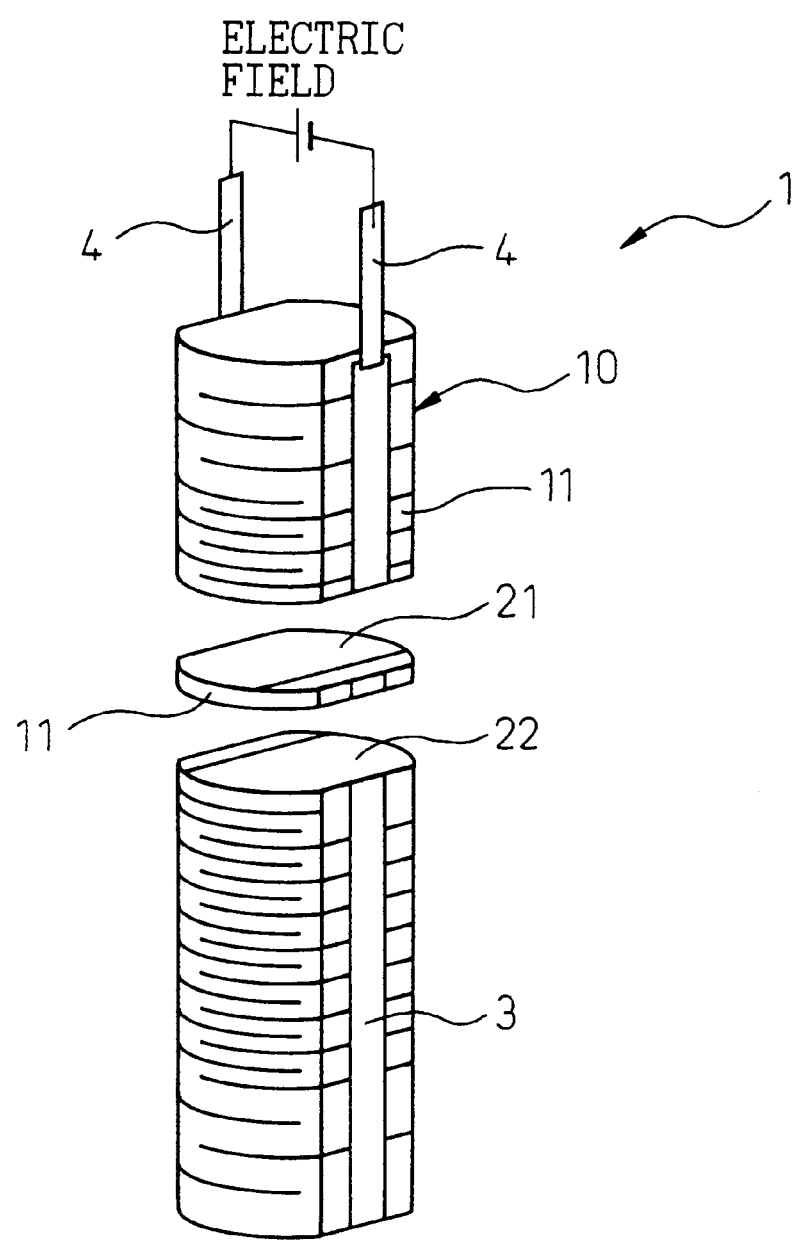
FIG. 3 is an explanatory view showing a construction of a piezoelectric actuator in Embodiment 2.

In other words, the piezoelectric actuator 1 in this embodiment is the one that uses a piezoelectric body 11 undergoing displacement upon the application of a voltage as shown in FIG. 3.

The crystalline structure of this piezoelectric body 11 substantially exists on the tetragonal side outside of the morphotropic phase boundary (MPB) between the tetragonal system and the rhombohedral system under the conditions of the lowest temperature, the lowest electric field and the maximum compressive stress that are used.

As the piezoelectric body 11, a PZT is produced that has a composition near MPB under the condition where the bias electric field of 0 kV/mm as the lowest field for use is applied at the lowest temperature for use of −40° C. and the maximum compressive stress of 40 MPa.

In this PZT, the Pb position on the A site is replaced by 9 mol % Sr and the (Zr, Ti) position on the B site is replaced by 1 mol % (Y: 1/2, Nb: 1/2) to achieve Zr/Ti (molar ratio)=53/47. Further, 0.2 wt % of Mn in terms of $Mn_2O_3$ is added to the perovskite composition.

PZT having this composition is processed to a disk having a diameter of 10 mm and a thickness of 0.2 mm in the same way as in Embodiment 1.

Next, the piezoelectric bodies 11 are made of this PZT. Internal electrode layers 21 and 22 are alternately laminated to form a ceramic laminate 10, and a side electrode 3 and an external electrode 4 are disposed on the side surfaces of the ceramic laminate 10 to form a piezoelectric actuator 1 as shown in FIG. 3. Various methods can be concretely employed to produce the piezoelectric actuator 1. This example employs a structure in which the shape of the piezoelectric body 11 has a barrel shape. This is called "Sample E2".

For comparison, a laminate type piezoelectric actuator (Sample C1) is prepared in this embodiment by using PZT having a composition near MPB at 20° C. and a low electric field in the absence of the stress and laminating it in the same way as described above. As a concrete composition of PZT in the sample C1, the Pb position is replaced by 9 mol % Sr and the (Zr, Ti) position on the B site is replaced by 1 mol % (Y: 1/2, Nb: 1/2) to attain Zr/Ti (molar ratio)=51.5/48.5. Further, 0.2 wt % of Mn in terms of $Mn_2O_3$ is added to these perovskite compositions.

Next, displacement of each of the sample E2 and the sample C1 of this embodiment is measured under the condition of the temperature range of from −40 to 165° C., the compressive stress of 40 MPa, the electric field of 0 to 2 kV/mm and the frequency of 0.1 Hz.

Figure 4:
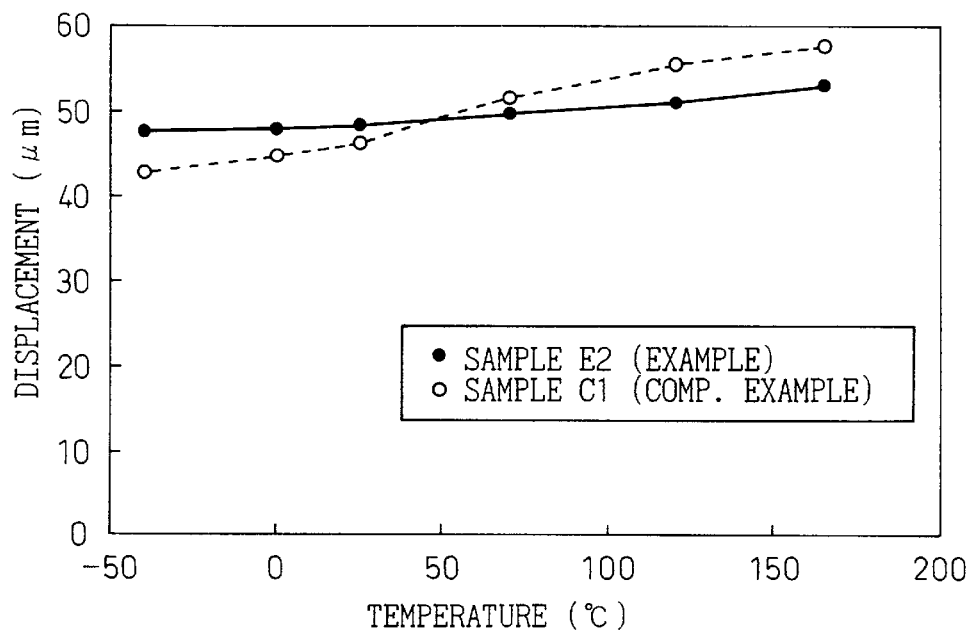
FIG. 4 is an explanatory view showing a change of displacement with temperature.

FIG. 4 shows the result. In the graph, the abscissa represents the temperature (° C.) and the ordinate represents the displacement ($\mu$m).

It can be seen from the graph that the sample E2 as the embodiment of the invention exhibits a smaller change of displacement than the sample C1 as Comparative Examples even when a temperature change occurs, and has flat and better temperature characteristics.

[Embodiment 3]

This embodiment represents an injector to which the piezoelectric actuator 1 according to Embodiment 2 can be applied.

Figure 5:
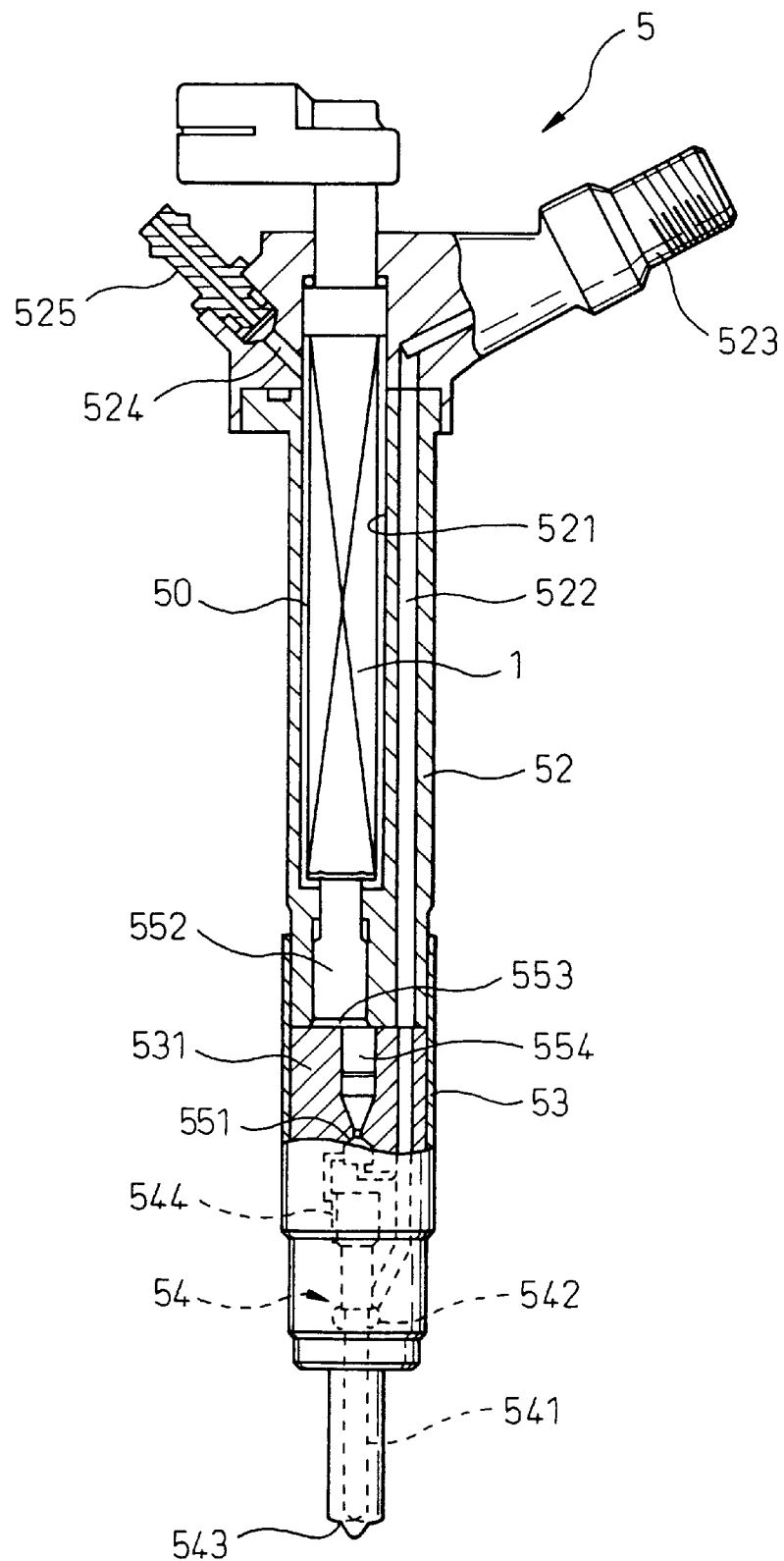
FIG. 5 is an explanatory view showing a construction of an injector in Embodiment 3.

This injector 5 is applied to a common rail injection system of a Diesel engine as shown in FIG. 5.

As shown in the drawing, the injector 5 includes an upper housing 5 for accommodating the piezoelectric actuator 1 described above as a driving portion and a lower housing 53 fixed to the lower end portion of the upper housing 52 and having an injection nozzle portion 54 formed therein.

The upper housing 52 is substantially cylindrical as shown in the drawing, and the piezoelectric actuator 1 is fitted and fixed into a longitudinal hole 521 that is eccentric relative to a center axis.

A high-pressure fuel passage 522 is defined on the side of the longitudinal hole 521 in parallel with this hole 521. The upper end portion of this passage 522 extends through a fuel introduction pipe 523 protruding to the upper portion of the upper housing 52, and communicates with an external common rail (not shown in the drawing).

A fuel introduction pipe 525 communicating with a drain passage 524 protrudes above the upper housing 52. The fuel flowing out from the fuel introduction pipe 525 is returned to a fuel tank (not shown).

The drain passage 524 communicates with a later-appearing three-way valve 551 through a passage, not shown, that extends through a clearance between the longitudinal hole 521 and the piezoelectric actuator 1 and from thence extends downwards inside the upper and lower housings 52 and 53.

The injection nozzle portion 54 includes a nozzle needle 541 sliding up and down inside a piston body 531 and an injection hole 543 opened and closed by the nozzle needle 541, for jetting the high-pressure fuel supplied from a fuel reservoir 542 into each cylinder of the engine. The fuel reservoir 542 is disposed round the center part of the nozzle needle 541, and the lower end portion of the high-pressure fuel passage 522 opens to this fuel reservoir 542. The nozzle needle 541 receives a fuel pressure from the fuel reservoir 542 in a valve opening direction and a fuel pressure from a back pressure chamber 544 so disposed as to face the upper end face, in a valve closing direction. When the pressure of the back pressure chamber 544 drops, the nozzle needle 541 lifts to open the injection hole 543 and the fuel is injected.

The three-way valve 551 increases or decreases the pressure of the back pressure chamber 544. The three-way valve 551 is selectively connected with the back pressure chamber 544 and the high-pressure passage 522 or the drain passage 524. The three-way valve 551 has a ball-like valve body for opening and closing a port communicating with the high-pressure chamber passage 522 or the drain passage 524. The driving portion 1 described above drives this valve body through a large diameter piston 552, an oil pressure chamber 553 and a small diameter piston 544 that are arranged below the driving portion 1.

The injector 5 having such a construction is installed in an automobile equipped with the Diesel engine and is used in a broad temperature range. Displacement accuracy of the piezoelectric actuator 1 in this injector 5 greatly affects performance of the Diesel engine. Therefore, displacement is preferably accurate throughout the full temperature range.

In contrast, the piezoelectric actuator 1 according to Embodiment 2 is most suitable for injectors, exhibits excellent performance and makes a great contribution to the improvement of performance of the injector 5.

Figure 6:
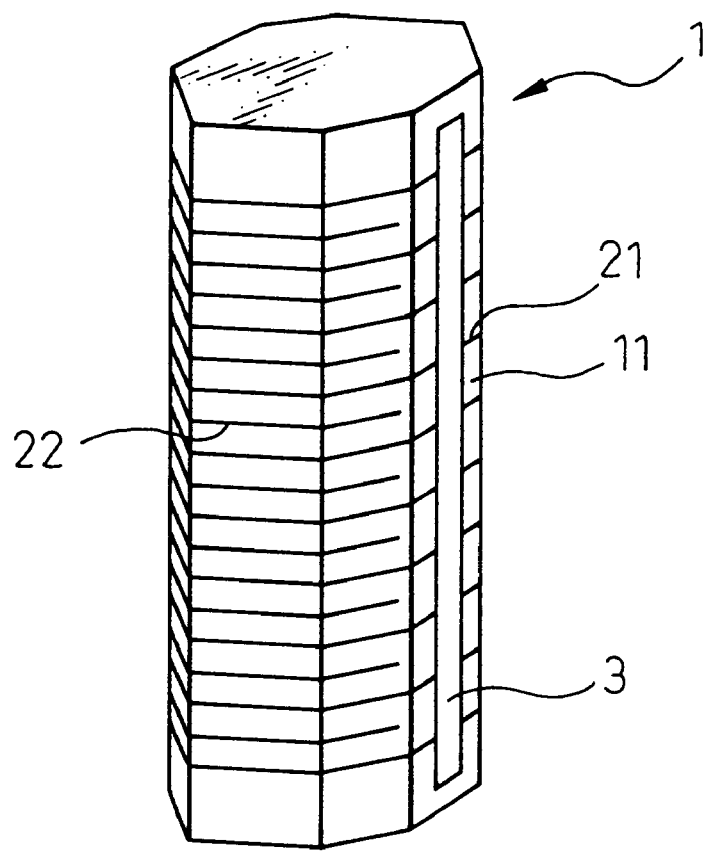
FIG. 6 is an explanatory view showing a modified example where the shape of the piezoelectric actuator of each of Embodiments 2 and 3 is changed.

In Embodiments 2 and 3, the piezoelectric actuator has a barrel-like sectional shape, but it may of course have an octagonal sectional shape as shown in FIG. 6.

What is claimed is:

1. A piezoelectric actuator using a piezoelectric body undergoing displacement upon application of a voltage as a driving source, characterized in that a crystalline structure of said piezoelectric body substantially exists on a tetragonal system side outside of a morphotropic phase boundary (MPB) between said tetragonal system and a rhombohedral system under conditions of the lowest temperature, the lowest electric field and the maximum compressive stress that are used.

2. A piezoelectric actuator according to claim 1, wherein said piezoelectric body is a PZT type oxide having an $ABO_3$ type perovskite structure.

3. A piezoelectric actuator according to claim 2, wherein a range of the temperature in which said piezoelectric body is used is from −40 to 200° C.

4. A piezoelectric actuator according to claim 2, wherein a range of the compressive stress in which said piezoelectric body is used is more than 0 and not more than 40 MPa.

5. A piezoelectric actuator according to claim 2, wherein a range of the electric field in which said piezoelectric actuator is used is from a negative coercive field to 4 kV/mm at the temperature used.

6. A piezoelectric actuator according to claim 2, wherein a range of the electric field in which said piezoelectric actuator is used is from −40° C. to a Curie point of the PZT type oxide.

7. A piezoelectric actuator according to claim 6, wherein a range of the compressive stress in which said piezoelectric body is used is more than 0 and not more than 40 MPa.

8. A piezoelectric actuator according to claim 2, wherein a range of the electric field in which said piezoelectric actuator is used is from 0 to 4 kv/mm.

9. A method for driving a piezoelectric actuator using a piezoelectric body undergoing displacement upon application of a voltage as a driving source, characterized in that said piezoelectric body is constituted so that a crystalline structure thereof substantially exists on a tetragonal system side outside of a morphotropic phase boundary (MPB) between said tetragonal system and a rhombohedral system under conditions of the lowest temperature, the lowest electric field and the maximum compressive stress that are used, and that said piezoelectric body is driven under conditions of at least said lowest temperature, at least said lowest electric field and not greater than said maximum compressive stress.

10. A method for driving a piezoelectric actuator according to claim 9, wherein said piezoelectric body is a PZT type oxide having an $ABO_3$ type perovskite structure.

11. A method for driving a piezoelectric actuator according to claim 9, wherein a range of the temperature in which said piezoelectric body is used is from −40 to 200° C.

12. A method for driving a piezoelectric actuator according to claim 9, wherein a range of the compressive stress in which said piezoelectric body is used is more than 0 and not more than 40 MPa.

13. A method for driving a piezoelectric actuator according to claim 9, wherein a range of the electric field in which said piezoelectric actuator is used is from a negative coercive field to 4 kV/mm at the temperature used.

14. A method for driving a piezoelectric actuator according to claim 9, wherein a range of the electric field in which said piezoelectric actuator is used is from −40° C. to a Curie point of the PZT type oxide.

15. A method for driving a piezoelectric actuator according to claim 10, wherein a range of the compressive stress in which said piezoelectric body is used is more than 0 and not more than 40 MPa.

16. A method for driving a piezoelectric actuator according to claim 9, wherein a range of the electric field in which said piezoelectric actuator is used is from 0 to 4 kV/mm.

* * * * *